(12) United States Patent
Vernon et al.

(10) Patent No.: US 6,268,725 B1
(45) Date of Patent: Jul. 31, 2001

(54) FLUX-GATE MAGNETOMETER WITH DRIVE SIGNAL FOR REDUCING EFFECTS OF ELECTROMAGNETIC INTERFERENCE

(75) Inventors: Scott D. Vernon, Chandler; Larry E. Tyler, Mesa, both of AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 09/069,472

(22) Filed: Apr. 29, 1998

(51) Int. Cl.⁷ ................................................. G01R 33/04
(52) U.S. Cl. ................................................... 324/253
(58) Field of Search ................................ 324/244, 246, 324/247, 249, 251, 253, 254, 255–258, 225

(56) References Cited

U.S. PATENT DOCUMENTS

| | | |
|---|---|---|
| 3,626,280 | 12/1971 | Van Englehoven et al. . |
| 3,638,074 | 1/1972 | Inouye ................................. 324/254 |
| 4,037,149 | 7/1977 | Foner . |
| 4,107,607 * | 8/1978 | Kirkland ............................. 324/253 |
| 4,277,251 * | 7/1981 | Lawson et al. ...................... 324/254 |
| 4,321,530 * | 3/1982 | Rhodes ................................. 324/253 |
| 4,447,776 | 5/1984 | Brown . |
| 4,933,637 * | 6/1990 | Ueda et al. .......................... 324/253 |
| 5,442,290 * | 8/1995 | Crooks ................................. 324/309 |
| 5,530,349 | 6/1996 | Lopez et al. ........................ 324/254 |
| 5,831,432 * | 11/1998 | Mohri ................................... 324/249 |

OTHER PUBLICATIONS

Ripka, P, "Review of fluxgate sensors," Invited Review, Sensors and Actuators A. 33 (1992), Elsevier Sequoia, pp. 129–141, 2/1992.

D.C. Scouten, "Sensor Noise In Low–Level Flux–Gate Magnetometers," by D.C. Scouten, *IEEE Transactions on Magnetics*, vol. Mag–8, No. 2 (Jun. 1972).

* cited by examiner

*Primary Examiner*—Jay Patidar
(74) *Attorney, Agent, or Firm*—Thomas F. Woods; Harold R. Patton (57) ABSTRACT

A flux-gate magnetometer having a drive signal for reducing the effects of electromagnetic interference (EMI) is provided. The drive signal has a characteristic that varies over time. For example, the drive signal may include a duty cycle that varies over time, the frequency of the drive signal may be varied over time, or the phase shift of the drive signal may vary over time.

5 Claims, 7 Drawing Sheets

FLUX-GATE MAGNETOMETER WITH DRIVE SIGNAL FOR REDUCING EFFECTS OF ELECTROMAGNETIC INTERFERENCE

FIELD OF THE INVENTION

The present invention relates to flux-gate magnetometers. More particularly, the present invention pertains to the reduction of the effects of electromagnetic interference (EMI) in the measurement of magnetic fields using flux-gate magnetometers.

BACKGROUND OF THE INVENTION

Flux-gate magnetometers have significant advantages in size, weight, power consumption, and reliability for use in the measurement of magnetic fields, particularly small magnetic fields. Generally, a flux-gate magnetometer includes one or more sensors which include a magnetizable core and at least one coil wound around the core. The flux-gate magnetometer senses the magnetic field by stimulating the sensor with a known signal. The known signal is used to drive the core in and out of saturation. The nonlinear magnetic properties of the core cause the second harmonic of the frequency of the known drive signal to be generated. The magnitude of the external magnetic field, i.e., the magnetic field to be measured, is proportional to or can be determined as a function of the second harmonic. For example, in the absence of any component of an external magnetic field, the peaks detected in an output voltage generated across a sensor of the flux-gate magnetometer may be uniform. On the other hand, in the presence of an external magnetic field, the voltage peaks may vary in a manner which may be measured by applying the output voltage to signal conditioning circuitry so as to provide a measurement signal representative of the external magnetic field to be measured.

In other words, the measurement of the external magnetic field is performed through modulation of a core of variable permeability. The modulated field is detected with the coil wound about the core. A change in permeability is accomplished with the known drive signal, e.g., drive current, in the coil wound about the core in such a fashion as to saturate the core during part of the cycle of the drive waveform. Modulation of the magnetic field to be sensed occurs only at even harmonics of the drive waveform due to the symmetry of the magnetization curve. Generally, the second harmonic is used as the measure of the external magnetic field.

Problems may occur in flux-gate magnetometers if operated in high noise environments, e.g., such as in an automobile or around other noisy equipment producing EMI. For example, if the frequency of the EMI is twice that of the drive signal, i.e., equal to the second harmonic frequency, the EMI will be undesirably sensed by the sensor(s) and interpreted as all or a part of an external magnetic field.

In the past, differential circuitry has been used to reduce the effects of EMI. For example, such differential techniques may involve the use of two sensors oriented opposite to one another in a magnetic field to be measured such that one sensor would provide a second harmonic signal which is inverted with respect to the other sensor. Using subtraction of the two signals, noise which is common to both of the sensors (i.e., common mode noise) can be canceled. However, in high noise environments, such differential circuit techniques do not provide adequate EMI immunity.

Conventionally, the drive signal used for driving the core in and out of saturation is a periodic and repetitive drive signal. For example, drive signals which have been used in the past to drive the sensors in and out of saturation include repetitive and periodic triangular waveforms and other repetitive and periodic waveforms, such as those waveforms having a constant duty cycle and/or a constant frequency over time. Flux-gate magnetometers are well known in the art, some examples of which may be found in the issued patents and references listed in Table 1 below.

TABLE 1

| Patent No. | Inventor(s) | Issue Date | Articles |
|---|---|---|---|
| 3,638,074 | Inouye | 25 January 1972 | "Sensor Noise in Low-Level Flux-Gate Magnetometers," by D.C. Scouten, IEEE Transactions on Magnetics, Vol. Mag-8, No. 2, (June 1972) |
| 5,530,349 | Lopez, et al. | 25 June 1996 | |

All references listed in Table 1 above are herein incorporated by reference in their respective entireties. As those of ordinary skill in the art will appreciate readily upon reading the Summary of the Invention, the Detailed Description of the Embodiments, and the claims set forth below, any of the devices or methods disclosed in the references of Table 1 may be modified advantageously by using the teachings of the present invention.

SUMMARY OF THE INVENTION

The present invention has certain objects. That is, various embodiments of the present invention provide solutions to one or more problems existing in the prior art with respect to the effects of EMI on flux-gate magnetometers. Such problems are present when flux-gate magnetometers are used in a high noise environment, such as in automobiles or around other equipment that generates noise. For example, if the frequency of EMI in the environment is twice that of the drive signal for the flux-gate magnetometer, the EMI will be sensed by the sensor(s) of the magnetometer and undesirably be interpreted as an external magnetic field. As such, inaccuracies in the measurement of external magnetic fields to be measured will result. While differential circuitry reduces the effects of EMI for flux-gate magnetometers in noisy environments, the reduction is inadequate for the high sensitivity desired for many magnetometer applications.

In comparison to known techniques for reducing EMI effects in flux-gate magnetometers, various embodiments of the present invention provide for further reduction in the effect of EMI on magnetic field measurement. The various embodiments of the present invention may provide one or more of the following advantages: allow the detection of very small magnetic fields in a very high noise environment; provide for further EMI immunity in a noisy environment when combined with the use of differential circuits; provide for a second harmonic signal that would not likely be followed by EMI in the noisy environment, and reduce EMI emissions.

Some embodiments of the invention include one or more of the following features: a drive signal generator operatively connected to drive one or more sensors of a flux-gate magnetometer, wherein the drive signal has a characteristic that varies over time; a drive signal that has a characteristic that is pseudo-randomly varied over time (e.g., a duty cycle of the signal that pseudo-randomly varies over time, a frequency that varies over time, or phase shift that varies over time); a drive signal that has a frequency that varies over time; a drive signal that has a frequency that is non-randomly varied over time such as a frequency varied over time in a predetermined pattern, e.g., not in a pseudo-random manner; translation circuitry operatively connected to sensor(s) of a flux-gate magnetometer to provide a measurement output representative of the external magnetic field based on the output from one or more sensors of a flux-gate magnetometer; differential circuitry for canceling common mode noise present at multiple sensors of a flux-gate magnetometer; a drive signal generator that includes a triangle wave oscillator having a controllable capacitance, wherein the controllable capacitance is used to vary the frequency of a triangle wave drive signal over time (e.g., introduce time jitter into the drive signal); and/or a drive signal generator that includes a triangle wave oscillator having a controllable current, wherein the controllable current is used to vary the frequency of a triangle wave drive signal over time (e.g., introduce time jitter into the drive signal).

DETAILED DESCRIPTION OF THE EMBODIMENTS

Figure 1:
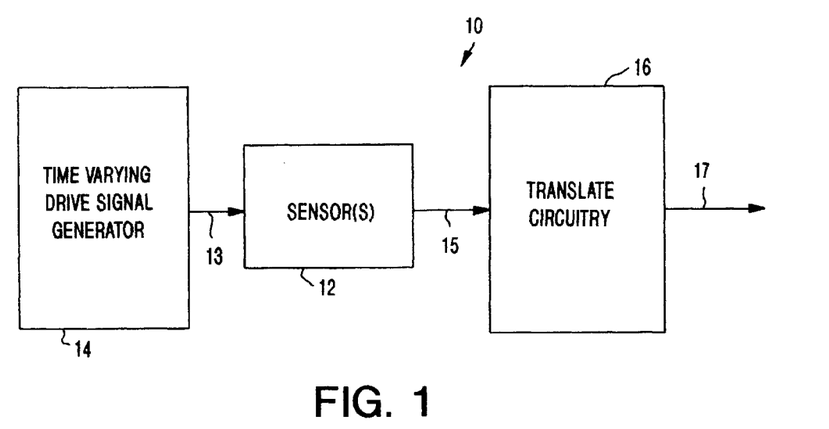
FIG. 1 shows a general block diagram of a flux-gate magnetometer in accordance with the present invention which includes a drive signal generator generating a drive signal having a characteristic that varies over time.

FIG. 1 shows a general block diagram of a flux-gate magnetometer device 10 permitting external magnetic fields, especially small magnetic fields, to be measured in a high noise environment. As used herein, small magnetic fields refer preferably to magnetic fields of about $10^{-7}$ gauss to about 1000 gauss, more preferably about $10^{-5}$ gauss to about 100 gauss.

Generally, the flux-gate magnetometer device 10 includes a sensor portion 12 which is driven in and out of saturation using a drive signal 13 generated by drive signal generator 14 according to the present invention. The magnetometer device 10 further includes translate circuitry 16 for receiving a sensor output signal 15 from sensor portion 12. Translate circuitry 16 provides for detection and/or signal conditioning of sensor output signal 15 to provide a device output 17 representative of the magnitude of an external magnetic field present at the sensor portion 12. As used herein, an external magnetic field is defined as any magnetic field produced externally to the magnetometer device as opposed to a field generated by the coil(s) in the magnetometer device, e.g., any DC magnetic field or any slowly varying magnetic field.

The sensor portion 12 may include one or more flux-gate sensors. For example, in the use of differential circuitry according to the present invention, sensor portion 12 may include two flux-gate sensors positioned with respect to the magnetic field to be measured such that one sensor output is inverted with respect to the other.

Various configurations of flux-gate sensors are known to one skilled in the art. The present invention is not limited to any particular flux-gate sensor, nor is it limited to any particular flux-gate sensor configuration. Generally, each flux-gate sensor of sensor portion 12 has a core that is made of a ferromagnetic material. Wound on the core is a sense coil driven by the drive signal 13, e.g., a current waveform, generated by drive signal generator 14 for use in driving the core in and out of magnetic saturation. The sense coil, i.e., a pick-up coil, of each sensor detects the changes in the magnetic permeability of the core when there is an external magnetic field present. An output 15 of the sensor, e.g., voltage across the sense coil of each sensor, is indicative of the external magnetic field present at each sensor. One skilled in the art will recognize that other flux-gate magnetometer sensors are known, such as those having a drive coil and a sense coil wound around a core. Further, it will be recognized by one skilled in the art that the sensors of the sensor portion may be located on chip with the other circuitry of the magnetometer device or off chip.

The flux-gate magnetometer device 10, therefore, senses a external magnetic field by stimulation of one or more sensors of sensor portion 12 with a known drive signal 13 generated by drive signal generator 14. Generally, the non-linear magnetic properties of the core of the sensor cause harmonics of the drive signal frequency to be generated. Preferably, the second harmonic is used as a measure of the external magnetic field. As such, the external magnetic field to be measured is proportional to the second harmonic signal generated at the sensor portion 12.

Generally, conventional drive signals or stimulus signals for flux-gate magnetometer sensors have been drive signals having a stable frequency. As referred to herein, a stable frequency drive signal refers to a repetitive periodic signal such as a constant frequency triangular waveform or a constant frequency square wave signal (e.g., a square wave signal having a constant duty cycle). With the use of a stable frequency drive signal, EMI that is present at twice that of the stimulus stable frequency drive signal is sensed by the one or more sensors of the flux-gate magnetometer and may be undesirably interpreted as at least a part of an external magnetic field. As such, the sensitivity of such flux-gate magnetometer devices using stable frequency drive signals is problematic, particularly from an immunity to EMI standpoint.

According to the present invention, drive signal generator 14 provides a drive signal 13 wherein the drive signal 13 has a time varying characteristic. As used herein, a drive signal having a time varying characteristic is defined as a drive signal having a time varying characteristic which makes it very unlikely that EMI could track or mimic the drive signal in a way such as to coincide with the second harmonic signal of that particular drive signal. Therefore, EMI is unlikely to be interpreted as the second harmonic signal which may be undesirably associated with a nonexistent external magnetic field.

As described in various embodiments herein, the time varying characteristic of the drive signal may take one of many different forms. However, such a time varying characteristic of the drive signal should make it unlikely that EMI could follow the second harmonic of the drive signal. Some characteristics which may be varied over time include duty cycle, frequency, period, phase shift, slew rate, and the like.

Further, depending upon the randomness of the time varying characteristic, EMI may be extremely unlikely to vary in the same manner as the drive signal. On the other hand, with regard to other time varying characteristics, EMI may be more likely to mimic some time varying characteristics. For example, the drive signal according to the present invention may be a drive signal whose frequency is varied over time in a pseudo-random manner or in a non-random manner such as according to a sinusoidal function. As one skilled in the art will recognize, the sinusoidal frequency varying drive signal will be more likely to be followed by EMI than a pseudo-random frequency varying drive signal.

Translate circuitry 16 may take one of many different configurations. Any circuitry which provides translation, signal conditioning, detection or any other function necessary to provide a device output 17 representative of the external magnetic field at sensor portion 12 based on sensor output 15 may be used in accordance with the present invention. As will be apparent from the more detailed description of embodiments of such circuitry provided herein, translate circuitry may include differential circuitry for cancellation of common mode noise at dual sensors, low pass filtering for filtering the sensor output and other functional circuitry, e.g., controlled inverters, multiplexers, latches, etc.

Figure 2:
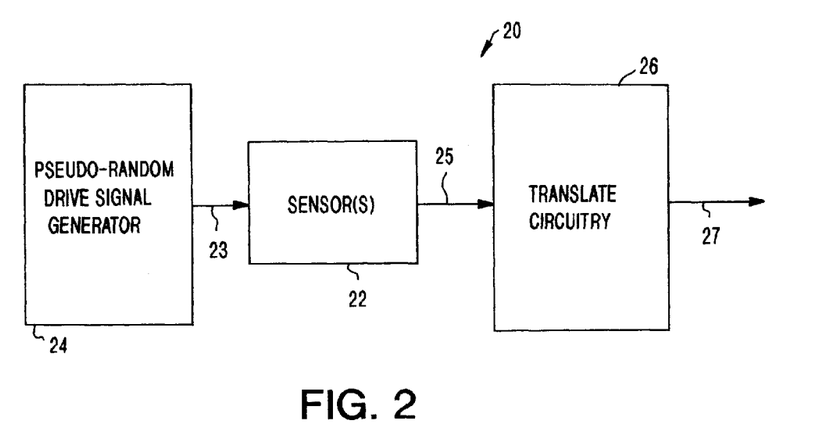
FIG. 2 illustrates a block diagram of one general embodiment of the flux-gate magnetometer as shown in FIG. 1 and which includes a pseudo-random drive signal generator according to the present invention.

FIG. 2 shows a block diagram of one embodiment of a flux-gate magnetometer device 20 in accordance with the generalized block diagram of FIG. 1. The flux-gate magnetometer device 20 includes a sensor portion 22 that is driven by pseudo-random drive signal 23 generated by pseudo-random drive signal generator 24. The output 25 of sensor portion 22 is translated and/or signal conditioned by translate circuitry 26 to provide an output 27 representative of an external magnetic field at the sensor portion 22.

Generally, the drive signal 23 generated by pseudo-random drive signal generator 24 may be any pseudo-random signal that is unlikely to be mimicked by EMI. For example, a pseudo-random signal generally has a repetitive random pattern, i.e., the random pattern generally repeats itself after a period of time. A random generator which has a completely random pattern may also be used but may be very difficult to construct.

Figure 4:
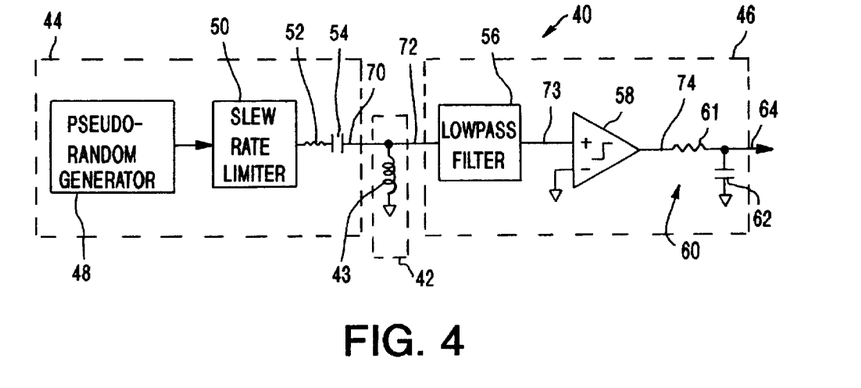
FIGS. 4–6 show more detailed block circuit diagrams of alternate embodiments of the flux-gate magnetometer shown in FIG. 2.
Figure 5:
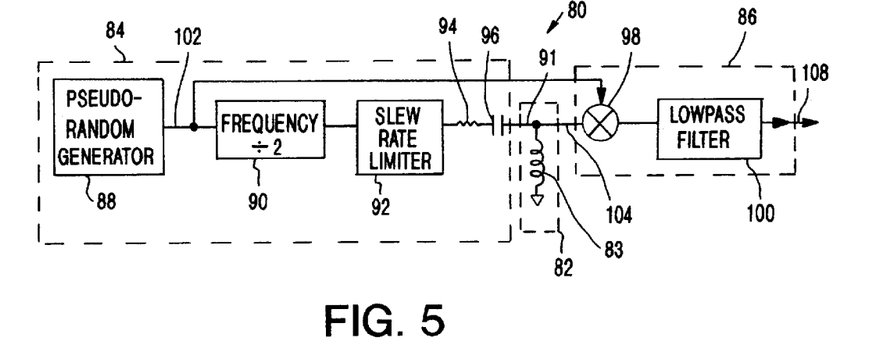
Figure 6:
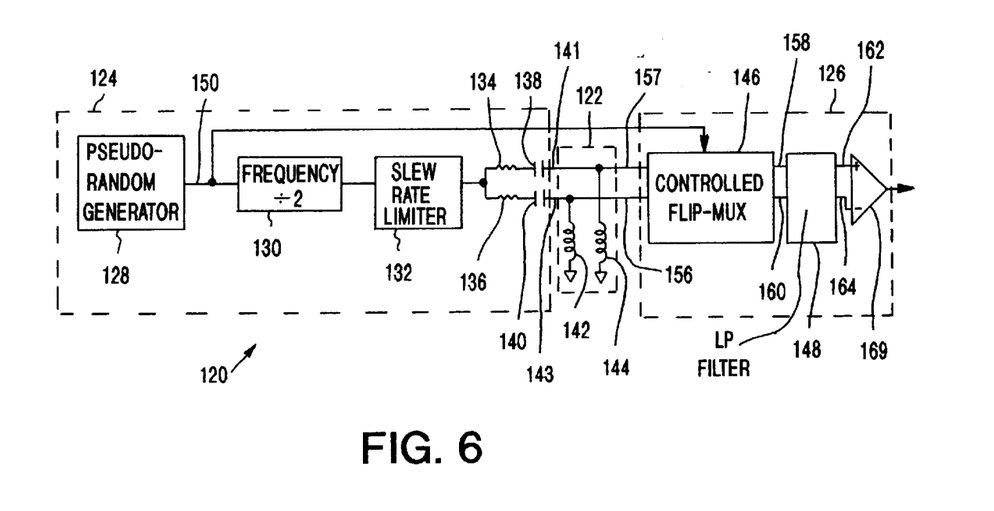
Figure 7A:
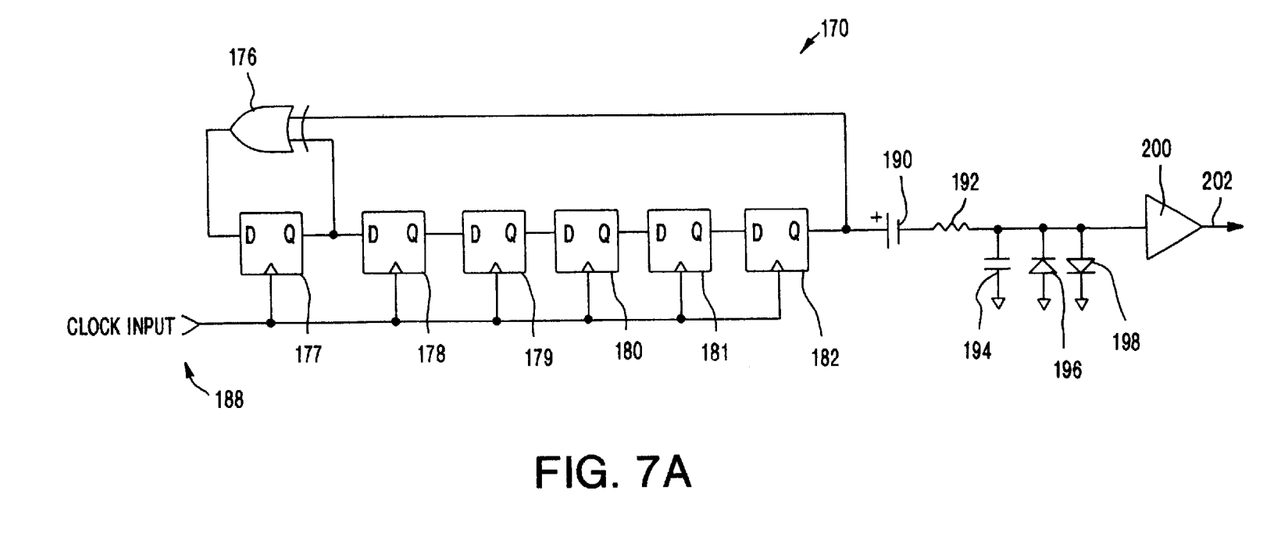
FIG. 7A is one illustrative embodiment of a pseudo-random drive signal generator such as that used in the alternate embodiments of FIGS. 4–6.

Various illustrative embodiments of flux-gate magnetometer devices using a pseudo-random drive signal generator are shown in the circuit block diagrams of FIGS. 4–6. Further, one illustrative schematic illustration of a pseudo-random generator is shown in FIG. 7A with an illustrative waveform therefrom shown in FIG. 7B. One skilled in the art will recognize that such illustrative configurations of FIGS. 4–6 are only provided to show the use of a pseudo-random drive signal 23 in a flux-gate magnetometer device and that various other illustrative embodiments including various other circuit components for the pseudo-random drive signal generator 24, sensor portion 22, and translate circuitry 26 are contemplated in accordance with the scope of the accompanying claims.

FIG. 4 shows a flux-gate magnetometer device 40 according to the present invention including a sensor portion 42, a pseudo-random generator portion 44, and translate circuitry 46. The pseudo-random generator portion 44 includes a pseudo-random generator 48, a slew rate limiter 50, an isolation resistor 52 and a DC blocking capacitor 54 for coupling the drive signal 70 to sensor portion 42. Translate circuitry 46 includes a low pass filter 56, a comparator 58, and an additional low pass filter 60 including resistor 61 and capacitor 62.

In operation of the flux-gate magnetometer device 40, the sensor portion 42, including sensor 43, is placed in an external magnetic field. The sensor output signal 72 of the drive signal 70 (i.e., output voltage across the sensor 43) is measured by the low pass filter 56, comparator 58, and low pass filter circuit 60. Such elements effectively measure the duty cycle of the signal 72 generated across sensor 43 which is a measure of the second harmonic of the drive signal 70. The low pass filter 56 provides for removal of high frequency components of EMI for presentation of signal 73 to comparator 58. Comparator 58 senses transitions of the input 73 thereto and provides an output 74 having a duty cycle representative of the external magnetic field present at sensor 43. The output 74 is presented to low pass filter 60 which filters signal 74 and provides device output 64 representative of a change in duty cycle proportional to the external magnetic field at the sensor portion 42, i.e., a change from 50 percent duty cycle.

It will be recognized that the duty cycle of a stimulus waveform that has been conventionally utilized (i.e., a stable frequency waveform or a periodic square wave drive signal) is generally always 50%. Only the action of the sensor in the external magnetic field changes the duty cycle to be other than 50%. According to the present invention, with use of a pseudo-random drive signal, the duty cycle changes over time. However, over time, the average duty cycle of the pseudo-random drive signal is also 50% and, therefore, an external magnetic field present at sensor 42 can be measured effectively in much the same manner as when a conventional stable frequency drive signal has been utilized only with improved immunity to EMI. It is unlikely that the EMI will track the pseudo-random nature of the drive signal 70 in a way so as to coincide with the second harmonic of the pseudo-random drive signal sequence. In accordance with the present invention, the EMI, if present, tends to add and subtract to the sensor output signal 72 equally, and would thus tend to be averaged out to about zero contribution by the low pass filter 60 at the output of the translate circuitry 46.

FIG. 5 shows an alternate embodiment of a flux-gate magnetometer device 80 using a pseudo-random drive signal. The flux-gate magnetometer 80 includes sensor portion 82 driven by a drive signal 91 generated by pseudo-random generator portion 84. Sensor output 104 of sensor portion 82 is then translated and signal conditioned by translate circuitry 86 to provide a device output 108 representative of an external magnetic field present at the sensor portion 82. In this particular embodiment of FIG. 5, the flux-gate magnetometer device 80 measures the second harmonic signal amplitude directly from the output signal rather than the duty cycle of the sensor output signal as described with reference to FIG. 4.

The pseudo-random generator portion 84 includes pseudo-random generator 88, a frequency divider circuit 90, slew rate limiter 92, an isolation resistor 94, and blocking capacitor 96 which couple the drive signal 91 to the sensor portion 82. Translate circuitry 86 includes a controlled inverter 98 which is presented with the sensor output signal 104 from sensor 83 of sensor portion 82 and the undivided output 102 from pseudo-random generator 88. Translate circuitry 86 further includes low pass filter 100 for providing device output 108 representative of an external magnetic field present at sensor portion 82.

In operation, the output 102 of the pseudo-random generator 88 is divided in frequency by two before it is used to drive the sensor portion 82. As such, the output signal 104 of sensor 83 will correspond directly to the undivided output 102 of pseudo-random generator 88. The sensor output 104 is presented to the controlled inverter 98 which inverts the signal 104, e.g., about 0 volts, whenever the undivided output 102 of the pseudo-random generator 88 goes low. The controlled inversion has the effect of translating or frequency shifting any components of the sense coil voltage output 104 which are at the undivided pseudo-random frequency to DC where they can be detected by the simple low pass filter 100. The frequency components which are at twice the drive frequency are representative of the external magnetic field to be measured. Any frequency components which are not at the undivided pseudo-random frequency will not be translated to DC and as such will be attenuated by the low pass filter 100. The frequency components not at the undivided pseudo-random frequency would include any EMI which might be injected into the system. As such, EMI immunity is dramatically increased.

Yet another alternate embodiment of a flux-gate magnetometer device 120 is shown in the circuit block diagram of FIG. 6. Again, magnetometer device 120 is an embodiment using a pseudo-random drive signal to drive the sensor such as shown generally in FIG. 2. The flux-gate magnetometer device 120 of FIG. 6 is substantially similar to the embodiment described with reference to FIG. 5 with the addition of differential circuitry for providing further EMI immunity.

The flux-gate magnetometer device 120 includes sensor portion 122. Sensor portion 122 includes two sensors 142, 144 providing differential sense outputs. Magnetometer device 120 further includes pseudo-random generator portion 124 and translate circuitry portion 126. The pseudo-random generator portion 124 includes pseudo-random generator 128, divide by frequency circuit 130, and slew rate limiter 132. The drive signal 143 is coupled to sensor 142 via isolation resistor 136 and blocking capacity 140 while the drive signal 141 is coupled to sensor 144 via isolation resistor 134 and blocking capacitor 138. The sense coil voltage outputs 156, 157 from the respective sensors 142, 144 are presented to a controlled flip-multiplexer device 146 of the translate circuitry 126. The outputs 158, 160 of the controlled flip-multiplexer 146 are then provided to low pass filter 148.

In operation, the two sensors 142, 144 are positioned and/or oriented opposite to one another in the magnetic field to be measured such that one sensor will generate a second harmonic output signal which is inverted with respect to the output of the other sensor. The flip-multiplexer 146 passes the two sense coil outputs 156, 157 unflipped when the undivided output 150 of the pseudo-random generator 128 is high, and flipped (i.e., with each other) when the undivided output 150 is low. Since swapping the two outputs is equivalent to inverting the differential output, the controlled inversion function is substantially equivalent to that of FIG. 5.

The outputs 158, 160 of the flip-multiplexer 146 are then low pass filtered by low pass filter 148 with the resultant outputs 162, 164 being presented to an amplifier 169. Amplifier 169 provides for amplification of the signals and subtraction of the two signals, thus canceling any common mode noise, i.e., noise common to both sensors 142, 144. The EMI immunity benefits due to the differential circuitry are in addition to those provided due to the use of the pseudo-random drive signal. Thus, with such a combination, EMI immunity is dramatically increased.

The controlled inverter 98 of FIG. 5 and/or the controlled flip-multiplexer 146 of FIG. 6 both provide an analog multiplier function or mixer function. Such analog multiplier functions can further be provided by a track and hold circuit or any other analog multiplier functional equivalent.

FIG. 7A is a schematic illustration of a particular embodiment of a pseudo-random drive signal generator in addition to a slew rate limiter as described with reference to FIGS. 4-6. The pseudo-random generator circuit 170 functions substantially as follows to provide a drive signal such as the signal illustratively shown in FIG. 7B.

Figure 7B:
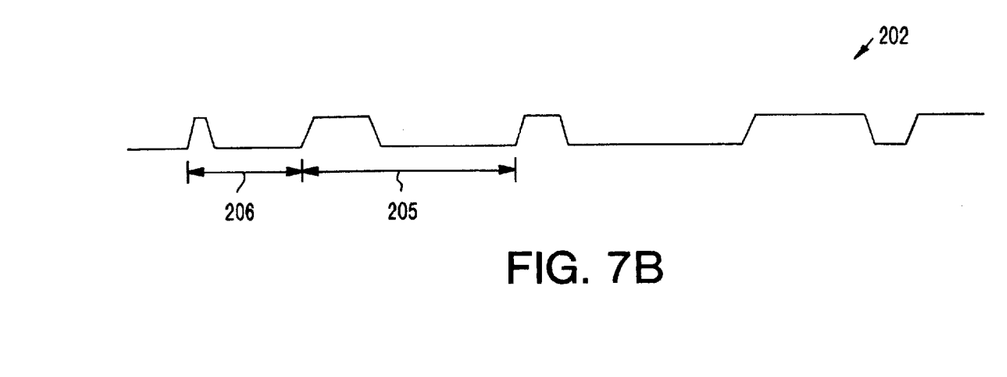
FIG. 7B is an illustrative signal generated by the pseudo-random drive signal generator of FIG. A.

As shown in FIG. 7A, six flip-flops 177–182 are arranged to form a delay line. The input to the first flip-flop 177 is driven by a logic gate 176 which computes the exclusive OR of the outputs of the first flip-flop 177 and sixth flip-flop 182. At any particular time, a six bit word is stored in the flip-flops 177–182. Circuit 170 cycles through all possible six bit words under control of clock 188, except the word with all zeros, in an apparently random order, before it repeats any word. Thus, the output of the sixth flip-flop 182 will generate a bit stream that toggles from low to high in a pseudo-random fashion. This signal is centered around ground by a capacitor 190. A resistor 192 and capacitor 194 limit the slew rate and the two diodes 196, 198 clip the waveform to form a slew limited waveform 202 such as shown in FIG. 7B. An amplifier 200 buffers the output signal 202 to increase its current drive capability.

The drive signal 202 of FIG. 7B generated by the signal generator circuit 170 of FIG. 7A is a signal having a duty cycle that varies over time. As shown in FIG. 7B, the signal is either a zero or a one for random periods of time. The signal may also be considered a signal whose frequency varies over time if each high transition is viewed as the start of a new cycle of a signal at a different frequency. In other words, cycle 206 has a different frequency than cycle 205, even though each signal is only one cycle long.

Figure 3:
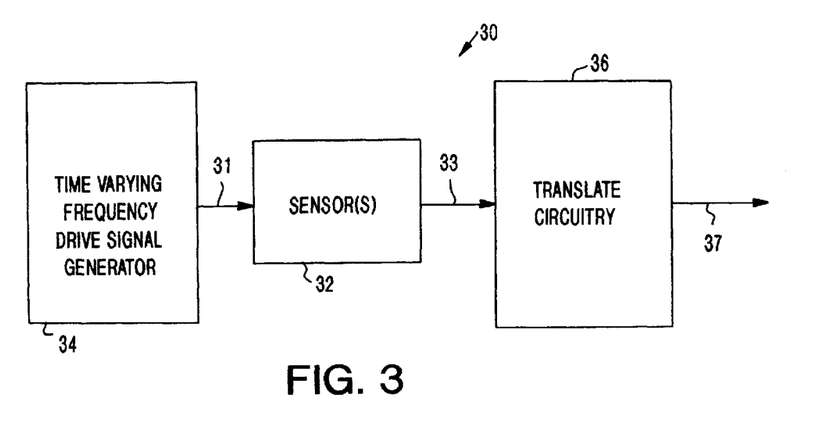
FIG. 3 shows a block diagram of another general embodiment of the flux-gate magnetometer of FIG. 1 and which includes a drive signal generator with time jitter or having a frequency that is varied over time according to the present invention.

FIG. 3 shows a block diagram of an alternate embodiment of a flux-gate magnetometer device 30 in accordance with the generalized block diagram of FIG. 1. The flux-gate magnetometer device 30 includes a sensor portion 32 that is driven by a drive signal 31. The drive signal 31 is generated by the time varying frequency drive signal generator portion 34 which provides a drive signal having a frequency that varies over time, e.g., a drive signal with time jitter or a drive signal having a frequency that varies sinusoidally over time. A sensor output 33, e.g., a coil voltage output, corresponding to an external magnetic field is presented to translate circuitry 36. Translate circuitry 36 provides for signal conditioning to result in a device output 37 representative of any external magnetic field present at sensor portion 32.

In general, various flux-gate magnetometers are configured to sense the time at which the magnetic core of the sensor exits and/or enters saturation. EMI could disturb these time measurements if it is synchronous with the drive signal. By introducing time variation of the frequency of the drive signal as described with reference to FIG. 3, the time in which the sensor enters and exits saturation is generally a non-synchronous event. For example, the drive signal may have time jitter introduced into the signal such that the frequency of the signal varies over time. As such, the times at which the sensor enters and exits saturation is very unlikely to be mimicked by EMI. In other words, EMI would not align itself with the times of the sensor transitions to and/or from saturation. In such a manner, the effects of EMI would sometimes advance the measured time of the transitions in and out of saturation and would sometimes delay the measured time of the transitions in and out of saturation. The effects of EMI would therefore tend to average out and have minimal effect on the magnetic field measurement of the flux-gate magnetometer device 30.

The flux-gate magnetometer device 30 of FIG. 3 includes sensor portion 32 which is driven by the time varying frequency drive signal generator portion 34. The time varying frequency drive signal generator 34 generates a drive signal 31 having a frequency that varies over time. Preferably, the frequency is varied over time in a pseudo-random manner. However, the variation of frequency over time need not be pseudo-random. Such variation over time can be performed in a non-random manner, such as in a predetermined pattern of variation. For example, the variation of frequency over time may be performed according to a sinusoidal function, a triangle function, or any other function that would provide variation over time in the frequency of the drive signal 31.

A pseudo-random drive signal, i.e., a drive signal varied in frequency over time in a pseudo-random manner, is preferred in that EMI is extremely unlikely to vary in the same pseudo-random pattern, whereas sinusoidal variation or other variations in frequency may more likely be mimicked by the EMI. As such, the pseudo-random drive signal provides for more effective EMI immunity.

The sensor output 33 of sensor portion 32 is presented to translate circuitry 36 for signal conditioning so as to provide a device output representative of an external magnetic field when present at sensor portion 32. Translate circuitry 36 may take any form which provides for such an output measurement signal 37. The present invention is not limited to any particular implementation of such translate circuitry 36.

It will be recognized by one skilled in the art that implementation of the flux-gate magnetometer device 30 with the drive signal 31 having a frequency that varies over time may be implemented using various techniques described previously with reference to FIGS. 4–6. For example, differential circuitry can be utilized in conjunction with the drive signal that has a frequency varying over time or EMI immunity may be provided with use of the time varying frequency drive signal alone.

Figure 8:
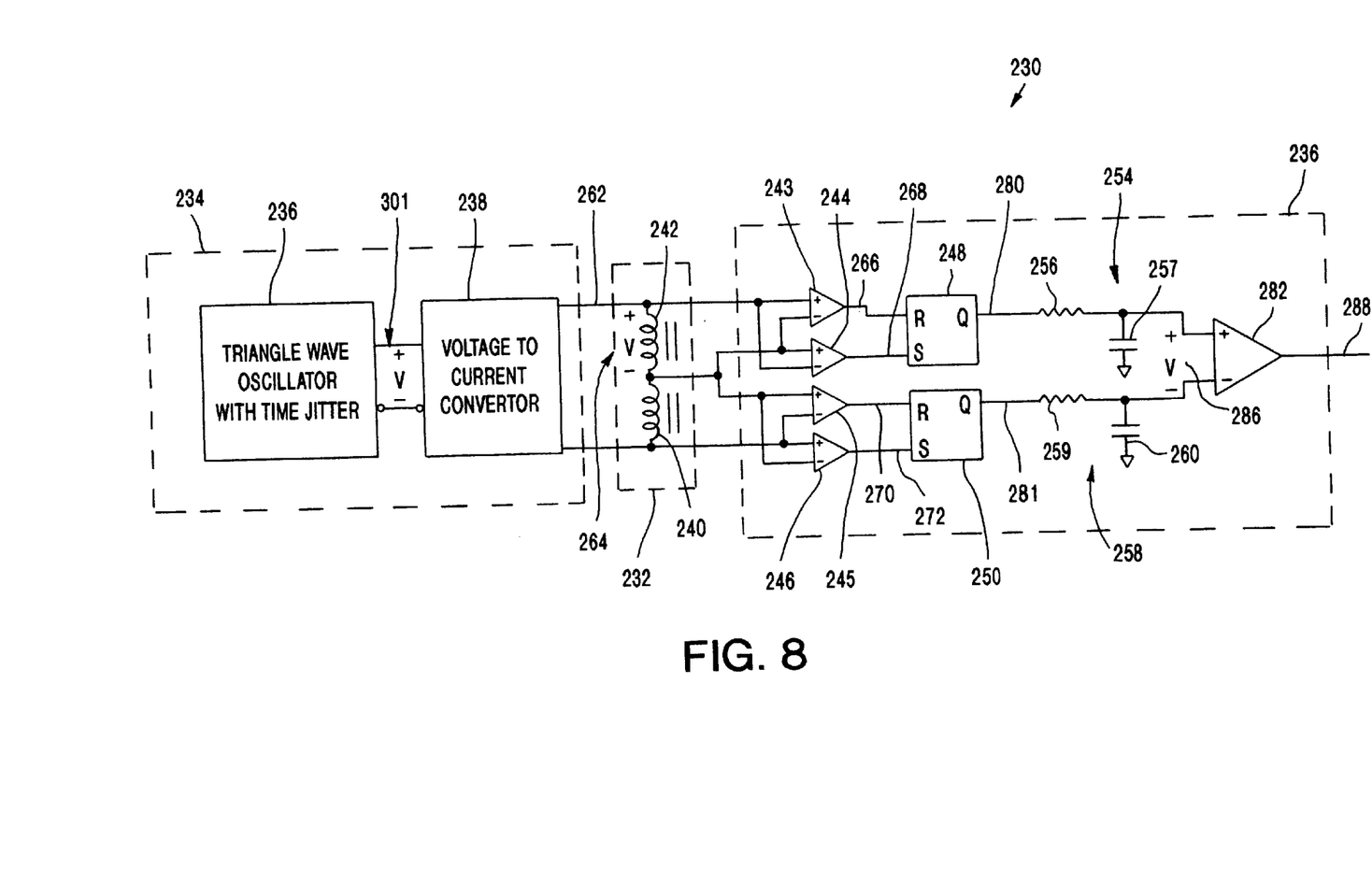
FIG. 8 is one illustrative embodiment of the flux-gate magnetometer of FIG. 3 according to the present invention.

FIG. 8 shows an illustrative block diagram of one embodiment of a flux-gate magnetometer device 230 according to the present invention as generally shown in the block diagram of FIG. 3. Flux-gate magnetometer device 230 includes drive signal generator portion 234 for providing current drive signal 262 to drive sensor portion 232. Sensor portion 232 includes generally represented sensors 240, 242. The sensor outputs are presented to translate circuitry 236 of the flux-gate magnetometer device 230. The translate circuitry 236 includes a bank of comparators 243–246; set-reset latches 248, 250; low pass filters 254, 258; and amplifier 282 for presenting device output 288 representative of any external magnetic fields present at sensor portion 232. Low pass filter 254 includes resistor 256 and capacitor 257, while low pass filter 258 includes resistor 259 and capacitor 260.

Figure 9A:
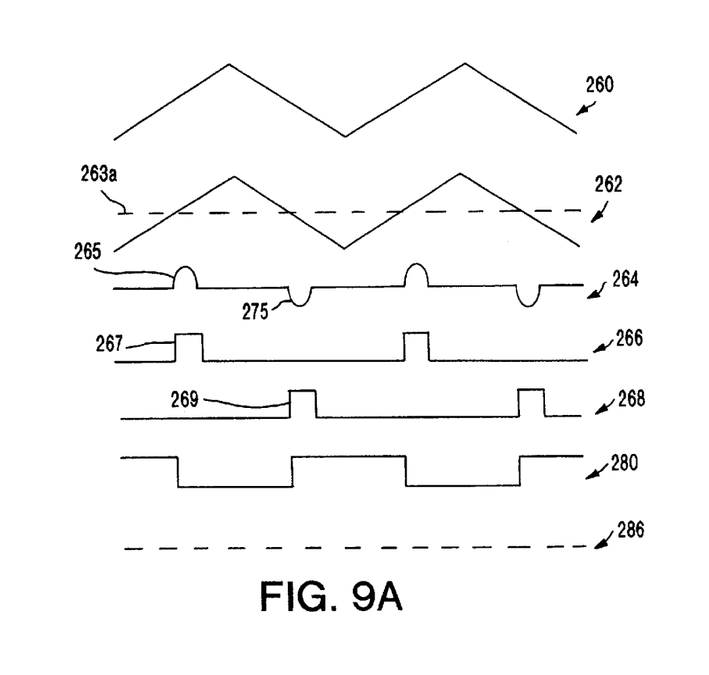
FIGS. 9A and 9B are waveform diagrams for use in describing the operation of the flux-gate magnetometer of FIG. 8.
Figure 9B:
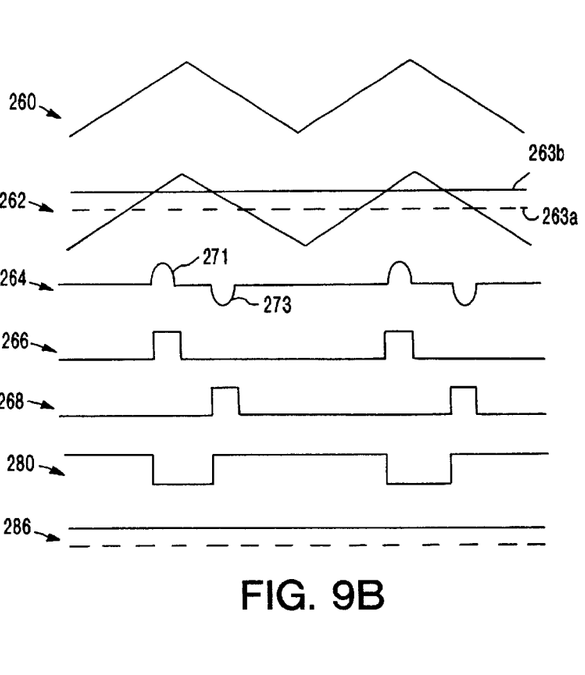
Figure 9C:
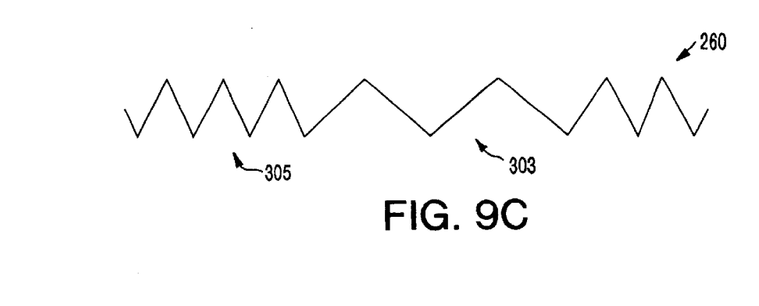
FIG. 9C an illustrative signal generated by the signal generator of FIGS. 10A–10B.
Figure 10A:
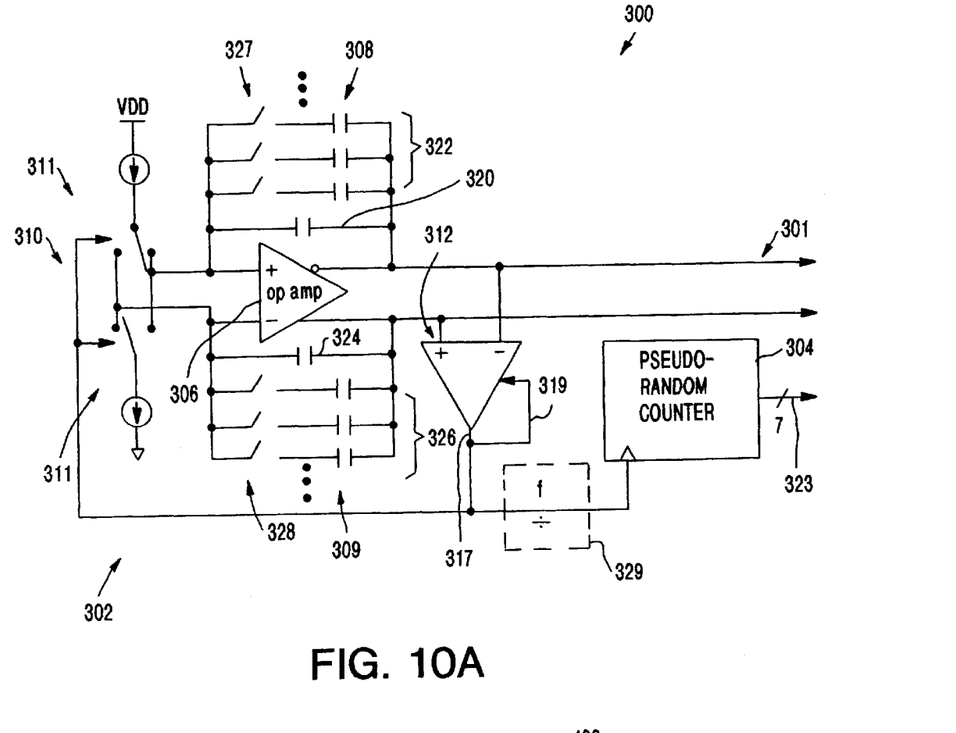
FIGS. 10A–10B are illustrative embodiments of triangle wave oscillators with time jitter for use in the flux-gate magnetometer of FIG. 8.

FIG. 10A shows one illustrative embodiment of a triangle wave oscillator with time jitter 300 for use in flux-gate magnetometer device 230 of FIG. 8. The triangle wave oscillator 300 provides a differential triangular waveform 301, wherein one illustrative voltage waveform 260 of the differential waveforms 301 is shown in FIG. 9C. As shown in FIG. 9C, the triangle waveform 260 has a portion 305 of the waveform at a first frequency, a portion 303 of the waveform at a second frequency, and other portions at other frequencies. As such, the waveform 260 has a frequency that varies over time. In the illustrative embodiment of the triangle wave oscillator shown in FIG. 10A, the differential triangle output 301 is pseudo-randomly varied over time.

The operation of the triangle wave oscillator with time jitter 300 is further described with reference to FIG. 10A. The operational amplifier 306 and capacitor banks 308, 309 are configured as a differential integrator. The operational amplifier 306 and capacitor banks 308, 309 integrate the constant current sources 311 forming a linear voltage ramp output until the linear voltage ramp equals the offset designed in comparator 312. At this time, the comparator 312 will change state and reverse the direction of the current sources 311 feeding the operational amplifier 306 and capacitor banks 308, 309. This is done generally by switch structure 310. The triangle wave output 301 will then have a linear ramp in the opposite direction.

The change in the output 317 of the comparator 312 is operatively connected to change the offset of the comparator to the opposite polarity as shown generally by line 319. When the linear ramp reaches the new offset, the current sources 311 are again reversed and the cycle repeats itself. The results of such circuits 302 (all except for pseudo-random counter 304 and frequency divide circuit 329) is an oscillation which never terminates, and which produces a differential linear triangle voltage output.

The circuit 302 shown in FIG. 10A is differential, e.g., operational amplifier 306 has two outputs, one inverted with respect to the other. However, one skilled in the art will recognize that the circuit and the operation of such a circuit does not require differential circuitry. However, the differential circuitry in the signal generator allows for enhanced EMI immunity in the oscillator and a differential oscillator output signal 301 for use in driving the sensor portion.

The time jitter introduced into the triangle waveform to provide a drive signal that varies in frequency over time is introduced into the triangle waveform under control of pseudo-random counter 304 and the variable capacitor banks 308, 309. In operation, each rising edge of the comparator output 317 of comparator 312 causes the pseudo-random counter 304 to generate a new random output 323, e.g., 7-bit random words. The variable capacitor bank 308 includes a fixed capacitor 320 and variable or switchable capacitors 322 controllable by switches 327. Variable capacitor bank 309 includes a fixed capacitor 324 and variable or switchable capacitors 326 controllable by switches 328. The random output words 323 generated by the pseudo-random counter 304 are applied to the switches 327, 328 to add and/or subtract capacitance. The slew rate of the triangle wave, hence the frequency of the waveform, is controlled by the capacitance of the capacitor banks 308, 309. Therefore, the frequency of the triangle waveform will vary over time in a pseudo-random fashion at the control of pseudo-random counter 304.

The fixed capacitors 320, 324 operatively connected to the operational amplifier are not controlled by the pseudo-random counter 304. As such, the frequency is allowed to vary around a center frequency determined by such capacitors 320, 324. For example, such a center frequency may be about 13.2 kilohertz in one particular illustrative embodiment. Preferably, the range of frequency may vary plus or minus 6 percent about the center frequency.

Using the triangle wave oscillator with time jitter 300 in the illustrative embodiment of the flux-gate magnetometer 230 shown in FIG. 8, the operation of the magnetometer device 230 shall be described. First, the circuit operation will be described with the assumption that no jitter is present in the drive signal. In other words, a constant frequency differential output 301 (waveform 260 of the differential output is shown in FIG. 9A and 9B) is used. The effects of varying the frequency over time will then be described. The differential triangular voltage output 301 (without time jitter) is applied to a voltage-to-current converter 238 which produces a triangle shaped current waveform 262 for driving sensors 240 and 242. Again, differential circuitry is utilized in the magnetometer device 230. In other words, two sensors 240, 242; two sets of comparators 243–246 with offset; two set-reset latches 248, 250; and two low pass filters 254, 258 are used to further provide common mode noise rejection and improved immunity to EMI.

As generally described previously, the sensors 240, 242 are constructed using a core material. The core material has a very abrupt transition between saturation and non-saturation. The core is non-saturated only when there is a very small magnetic field present in the core. When the core is non-saturated, the sense coil has a relatively high value of inductance. In the presence of a magnetic field, the core material enters magnetic saturation and the inductance of the sense coil has a relatively low value. The magnetic field within the core is generally represented as the vector sum of the magnetic field due to the current flowing through the coil and an external magnetic field which is to be measured.

FIGS. 9A and 9B show various waveforms during the operation of the flux-gate magnetometer device 230 of FIG. 8. FIG. 9A shows waveforms with regard to the case of a zero external magnetic field, i.e., no external magnetic field is present at sensors 240, 242 of magnetometer device 230. FIG. 9B shows waveforms for the case where an external magnetic field is present at such sensors 240, 242, i.e., a non-zero external magnetic field.

With respect to operation of the illustrative magnetometer device 230 in a zero external magnetic field, the differential triangle wave output 301 is generated by the triangle wave oscillator circuit 300 of FIG. 10A although other circuits may be used to provide the differential output. The differential output 301, represented by the triangular voltage waveform 260 (see FIG. 9A and 9B), is applied to voltage-to-current converter 238 which results in the triangular current waveform 262 that is applied as the drive signal to the sensors 240, 242.

During most portions of the triangular current waveform 262, the core of sensors 240, 242 are saturated and the sense coil thereof has a low inductance. Only when the triangular current waveform 262 is near zero, i.e., zero line 263a, does the core exit saturation. At the exit of saturation, the sense coil inductance rapidly increases. Thus, when the coil exits saturation, a voltage pulse 265 as shown in waveform 264, appears across the sense coil. This voltage pulse 265 disappears when the core re-enters saturation, i.e., the current is not near zero. A voltage pulse 275 of opposite polarity appears across the sense coil when the triangular waveform 262 passes through zero current in the opposite direction, as is also shown in the waveform 264. As such, when the core enters and exits saturation, a voltage appears across the sense coil resulting in the voltage pulses 265, 275 as shown in the waveform 264 of FIG. 9A.

The comparators 243–246 have a built-in offset, e.g., 300 millivolts. As such, these comparators 243–246 are configured to detect the presence of the sense coil voltage pulses 265, 275. Such pulses, for example, may be about 600 millivolts in amplitude. The outputs of the comparators 243–246 are shown in the waveforms 266, 268. As shown in FIG. 9A, the waveforms 266, 268 include output pulses 267, 269 which follow the positive voltage pulses 265 and negative voltage pulses 275 of waveform 264, respectively. Further, the outputs 270 and 272 would follow such positive and negative voltage pulses of associated circuitry.

The output of the set-reset latch 248 having waveforms 266, 268 applied thereto is then shown in waveform 280 of FIG. 9A. Likewise, waveform 281 out of set-reset latch 250 will be of similar nature. As can be recognized from the waveform 280 of FIG. 9A, if the external magnetic field is zero, then the pulses out of the two sensors 240, 242 will be approximately identical and the duty cycles of the waveforms 280, 281 from the set-reset latches 248, 250 will be about 50%. The low pass filters 254, 258 are configured to detect the duty cycle of the waveform 280 and corresponding waveform 281 of the differential circuit, respectively. With no external magnetic field present, the net voltage as shown by waveform 286 is zero and the device output after amplification by subtracting amplifier 262 shown as device output 288 will be zero indicating a zero sensed external magnetic field. As shown in FIG. 9A, the outputs 280 and 281 are representative of the core exiting saturation because the rising edge of the comparator outputs are used to trigger the set-reset latches. However, one skilled in the art will recognize that the falling edge of the comparators could be used to trigger the set-reset latches making the outputs 280, 281 representative of the core entering saturation. Further a combination of enter and exiting saturation could be used.

The case where a non-zero external magnetic field is present at sensors 240, 242 is shown by the waveforms of FIG. 9B. Again, this is shown with no jitter being introduced into the drive signal 260. In the case where an external magnetic field is present, the voltage pulses 271, 273 (as shown in waveform 264) across the sensor 240 occur when the field, due to the triangle current waveform 262, cancels the external magnetic field which is to be sensed. Thus, the presence of the external magnetic field effectively shifts the "zero" line 263a of zero external magnetic field, as shown in FIGS. 9A–9B, waveform 262. In other words, the zero line 263a is representative of where the external magnetic field present is canceled by current flowing through the coil of sensor 240. As shown in waveform 262 of FIG. 9B zero line 263a with no external magnetic field present is shifted to line 263b indicating the presence of such an external magnetic field.

The voltage pulses 271, 273 as shown in waveform 262, FIG. 9B, across the sense coil occur when the current of the triangular waveform 262 crosses the zero line 263b. The comparators 243, 244, therefore, produce the voltage waveforms 266, 268 as shown in FIG. 9B. This results in a non-50% duty cycle at set-reset latch output shown by waveform 280 of FIG. 9B. Such a non-50% duty cycle is representative of the external magnetic field present at the sensor portion 232.

With use of differential circuitry, the two sensors 240, 242 are oriented opposite to one another relative to the magnetic field to be sensed and as such output inversion of the waveform 280 associated with sensor 240 occurs for waveform 281 associated with sensor 242. Thus, the output 281 of the set-reset latch 250 will be equal and opposite to the output 280 of the set-reset latch 248 resulting in a net voltage signal 286 at the low pass filter output 262 representative of the external magnetic field present at the sensor portion 232. The net signal 286 is then amplified and presented as device output 288 indicating the magnitude of the external magnetic field.

With no jitter introduced in the frequency of the current waveform 262, EMI could occur at the center frequency, e.g., 13.2 kilohertz, and move the perceived time in which the voltage pulses 271, 273 as shown in waveform 264 occur in the sense coils. As such, an erroneous output duty cycle and therefore voltage device output for an external magnetic field to be measured would result.

When jitter is introduced into the triangular waveform, such as for example as shown in the waveform 260 of FIG. 9C, EMI is very unlikely to follow the time varying frequency of the current waveform 301 and hence EMI is very unlikely to be interpreted by the flux-gate magnetometer device 230 as a consistent error in the voltage pulses across the sensors. Instead, EMI is interpreted as a random signal which sometimes advances the time of the voltage pulses 271, 273 and sometimes delays the perceived time of the voltage pulses 271, 273. As such, low pass filters 254, 258 having the duty cycle waveforms 280, 281 applied thereto will average these random errors to about zero. Therefore, immunity to EMI, i.e., EMI that would affect conventional magnetometers driven with stable frequency waveforms, is greatly enhanced.

The use of a drive signal with a frequency that varies over time is most effective when the time of the voltage pulses from the sense coils are randomly distributed about 360° of phase of the center frequency for the magnetometer, e.g., 13.2 kilohertz. However, the amplitude of the response of the flux-gate magnetometer device 230 is different at different oscillator frequencies. This could cause noise at low frequencies if the dither capacitors, i.e., variable capacitors of the signal drive generator, are simply increased. To prevent such noise problems, an optional frequency divider 329 between the comparator 312 of the triangle wave oscillator 300 of FIG. 10A and the pseudo-random counter 304 thereof can be inserted. Such an optional frequency divider 329 holds each pseudo-random word for several oscillation cycles, as determined by the divide by integer of the frequency divider 329, before moving to the next pseudo-random word 323. Therefore, any frequency variation for the pseudo-random variation in the oscillator frequency is given time to accumulate into a wide phase shift before a new pseudo random word 323 is selected for variation of the frequency of the drive signal.

Figure 10B:
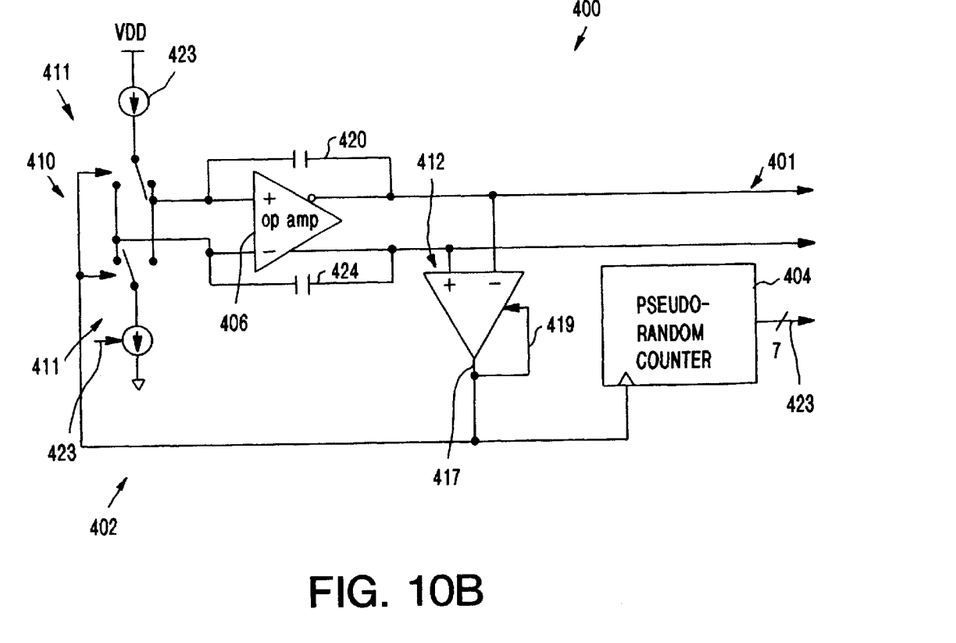

One skilled in the art will recognize that the pseudo-randomly varied frequency drive signal may be generated by circuits having a variety of configurations other than that of FIG. 10A. For example, as shown in FIG. 10B, the differential triangular output 401 is generated by a circuit 400 using a controllable current as opposed to a controllable capacitance. The operation of circuit 400 is further described with reference to FIG. 10B. The operational amplifier 406 and capacitors 420, 424 are configured as a differential integrator. The operational amplifier 406 and capacitors 420, 424 integrate the controllable current sources 411 forming a linear voltage ramp output until the linear voltage ramp equals the offset designed in comparator 412. At this time, the comparator 412 will change state and reverse the direction of the current sources 411 feeding the operational amplifier 406 and capacitors 420, 424. This is done generally by switch structure 410. The triangle wave output 401 will then have a linear ramp in the opposite direction.

The change in the output 417 of the comparator 412 is operatively connected to change the offset of the comparator to the opposite polarity as shown generally by line 419. When the linear ramp reaches the new offset, the current sources 411 are again reversed and the cycle repeats itself. The results of such circuits 402 (all except for pseudo-random counter 404) is an oscillation which never terminates, and which produces linear triangle voltage waveforms 301 inverted with respect to one another assuming that controllable current sources 411 are held constant.

To provide a drive signal that varies in frequency over time, pseudo-random counter 404 is used to control controllable current sources 411. In operation, the comparator output 417 of comparator 412 causes the pseudo-random counter 404 to generate a new random output 423, e.g., 7-bit random words. The random output words 423 generated by the pseudo-random counter 404 are applied to the controllable current sources 411 to vary the level of current supplied and hence vary the frequency of the waveform in a pseudo-random fashion at the control of pseudo-random counter 404.

Figure 11A:
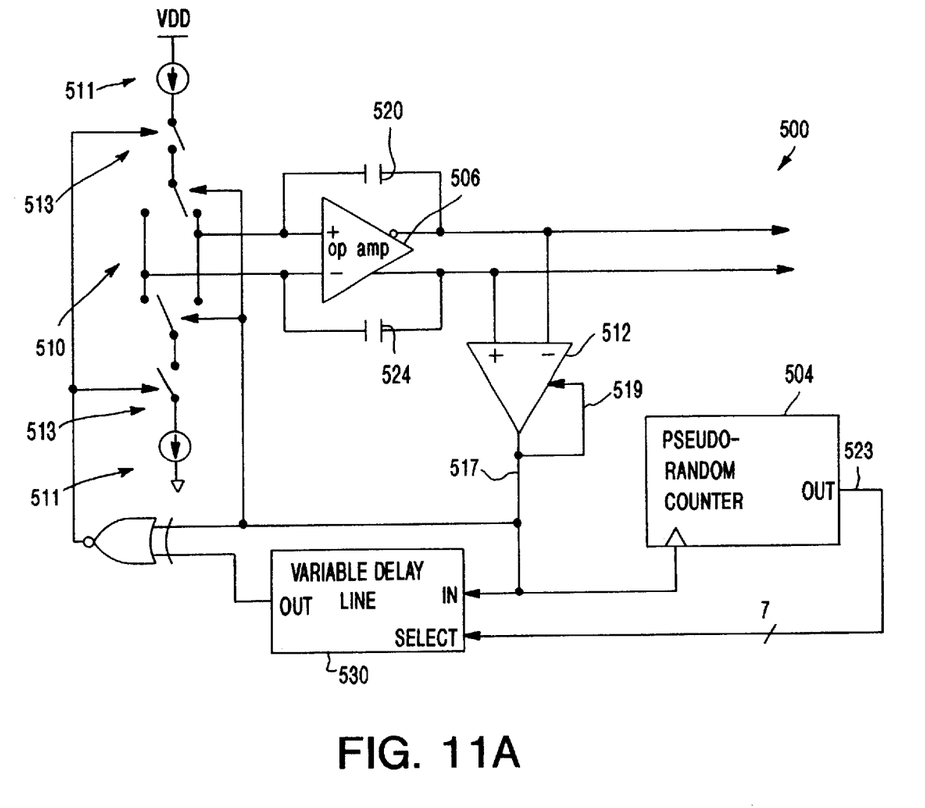
FIG. 11A is an illustrative embodiment of a circuit which implements a variable phase shift in a drive signal over time.
Figure 11B:
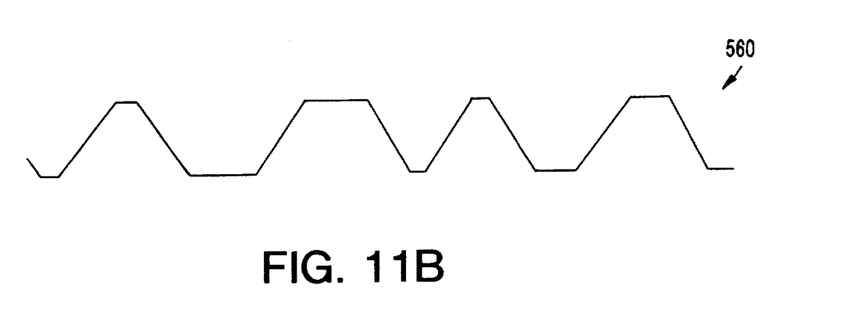
FIG. 11B an illustrative waveform generated by the circuit of FIG. 11A.

Further, with respect to other characteristics that can be varied over time in accordance with the present invention, FIG. 11A is an illustrative embodiment of a circuit 500 which implements a variable phase shift in a drive signal over time. FIG. 11B is an illustrative waveform 560 of the differential output 501 generated by the circuit 500 of FIG. 11A.

The operation of circuit 500 is further described with reference to FIG. 11A. The operational amplifier 506 and capacitors 520, 524 are configured as a differential integrator. The operational amplifier 506 and capacitors 520, 524 integrate the controllable current sources 511 forming a linear voltage ramp output until the linear voltage ramp equals the offset designed in comparator 512. At this time, the comparator 512 will change state and the output of exclusive NOR gate 532 goes low. This causes both the current sources 511 feeding the operational amplifier 506 to turn off per switches 513, resulting in no current output change until the comparator signal output 517 propagates through the variable delay line 530. The current output does not change even though the comparator output 517 has been applied to switch structure 510 to allow ramping in the opposite direction. When the comparator signal 517 propagates through the delay line 530, i.e., is applied to the exclusive NOR gate 532, the exclusive NOR output goes high, initiating a ramp in the opposite direction.

The change in the output 517 of the comparator 512 is operatively connected to change the offset of the comparator to the opposite polarity as shown generally by line 519. When the linear ramp reaches the new offset, the current sources 511 are again reversed and controlled as described above using switch structure 510 and switches 513.

The pseudo-random counter 504 is used to control the variable delay line, i.e., control the delay in presenting the input of delay line 530 to the exclusive NOR gate 532, and as such control the time the current sources are turned off via switches 513. In operation, the comparator output 517 of comparator 512 causes the pseudo-random counter 504 to generate a new random output 523, e.g., 7-bit random words. The random output words 523 generated by the pseudo-random counter 504 are applied to the variable delay line and hence vary the phase shift of the waveform in a pseudo-random fashion.

The preceding specific embodiments are illustrative of the practice of the invention. It is to be understood therefore that other expedients known to those skilled in the art or disclosed herein may be employed without departing from the invention or the scope of the appended claims. For example, the present invention is not limited to a drive signal having a frequency that varies over time in a pseudo-random manner, but further is intended to include a drive signal which varies in frequency in any predetermined pattern. The present invention is also not limited to use in any particular application setting per se but may find application as a part of an automotive device, system, or any other application where external magnetic fields are to be measured. The present invention further includes within its scope methods of making and using the flux-gate magnetometer device described herein above.

In the claims, means plus function clauses are intended to cover the structures described herein as performing the recited function and not only structural equivalents but also equivalent structures. Thus, for example, although a nail and a screw may not be structural equivalents in that a nail employs a cylindrical surface to secure wood parts together, whereas a screw employs a helical surface, in the environment of fastening wooden parts, a nail and a screw are equivalent structures.

What is claimed is:

1. A flux-gate magnetometer device for use in measuring an external magnetic field for providing measurement output, the device comprising:

at least one flux-gate sensor, a drive signal generator including means for dividing the frequency of the drive signal by two, resulting in a frequency divided drive signal and a non-frequency divided drive signal;

means for applying the frequency divided drive signal to at least one flux-gate signal;

translation means including means for controlling the inversion of the at least one sensor output signal based on the non-frequency divided drive signal resulting in a translated signal; and means for filtering the translated signal to provide the measurement output.

2. The device of claim 1 wherein said translation means includes translation circuitry operably connected to the at least one flux-gate sensor to provide the measurement output representative of an external magnetic field based on the at least one sensor output signal.

3. The device of claim 2 wherein the translation circuitry includes means for measuring the duty cycle of the signal at the at least one flux-gate sensor.

4. The device of claim 1 wherein said translation means includes means for conditioning the sensor output signal to cancel common mode noise present at the sensors.

5. The device according to claim 1 wherein said translation means is connected to the at least one sensor to provide a measurement output representative of the external magnetic field based on the at least one sensor output signal.

* * * * *